(12) United States Patent
Maruyama et al.

(10) Patent No.: US 6,636,455 B2
(45) Date of Patent: Oct. 21, 2003

(54) SEMICONDUCTOR MEMORY DEVICE THAT OPERATES IN SYNCHRONIZATION WITH A CLOCK SIGNAL

(75) Inventors: Yukiko Maruyama, Hyogo (JP); Seiji Sawada, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/135,507

(22) Filed: May 1, 2002

(65) Prior Publication Data

US 2003/0048691 A1 Mar. 13, 2003

(30) Foreign Application Priority Data

Sep. 7, 2001 (JP) ........................................ 2001-271600

(51) Int. Cl.[7] ................................................. G11C 8/00
(52) U.S. Cl. ............... 365/233; 365/189.05; 365/230.08
(58) Field of Search ............................ 365/233, 189.22, 365/189.09, 189.01, 189.04, 189.05, 230.03, 230.08, 201

(56) References Cited

U.S. PATENT DOCUMENTS

| 5,896,336 | A | * | 4/1999 | McClure | 365/205 |
| 6,288,957 | B1 | * | 9/2001 | Katoh et al. | 365/201 |
| 6,292,421 | B1 | * | 9/2001 | Shore et al. | 365/222 |
| 6,292,428 | B1 | * | 9/2001 | Tomita et al. | 365/233 |
| 6,295,245 | B1 | * | 9/2001 | Tomita et al. | 365/233 |
| 6,473,358 | B2 | * | 10/2002 | Noda et al. | 365/230.06 |

* cited by examiner

Primary Examiner—David Nelms
Assistant Examiner—Gene N. Auduong
(74) Attorney, Agent, or Firm—McDermott, Will & Emery

(57) ABSTRACT

This DDR SDRAM, in the normal operation mode, performs a writing operation having a writing latency and, in the testing mode, performs a writing operation without having a writing latency by receiving a data strobe signal and a data signal one clock cycle before a writing command. Therefore, the testing time is short even if the test is carried out at a low frequency.

7 Claims, 12 Drawing Sheets

SEMICONDUCTOR MEMORY DEVICE THAT OPERATES IN SYNCHRONIZATION WITH A CLOCK SIGNAL

BACKGROUND OF THE INVENTION

1. Field of the Invention

The present invention relates to a semiconductor memory device, and more particularly to a semiconductor memory device that takes in an external control signal, an external address signal, and an external data signal in synchronization with a clock signal.

2. Description of the Background Art

In recent years, a DDR (double data rate) SDRAM (synchronous dynamic random access memory) is developed which takes in an external data signal in synchronization with both a rising edge and a falling edge of a clock signal. In this DDR SDRAM, a data strobe signal is used to minimize the time skew between chips in a memory system, and a writing operation having a writing latency of one clock cycle is carried out.

However, since such a DDR SDRAM has a writing latency, the minimum period of time tRC needed for one data writing corresponds to five clock cycles (See FIG. 12), so that the testing time is long if the test is carried out at a low frequency, thereby raising a problem of high costs for testing.

SUMMARY OF THE INVENTION

Thus, a principal object of the present invention is to provide a semiconductor memory device having a short testing time.

A semiconductor memory device according to the present invention includes a memory array having a plurality of memory cells arranged in a matrix form, a word line disposed in correspondence with each row, and a bit line pair disposed in correspondence with each column; a row selection circuit that selects the word line of the row corresponding to the row address signal in response to an active command and activates each memory cell in the row; a column selection circuit that selects the bit line pair of the column corresponding to the column address signal in response to a writing command; and a writing circuit that, in a normal operation mode, takes in the external data signal when a predetermined first period of time passes after the writing command is issued, and, in a testing mode, takes in the external data signal in response to the active command being issued, to write the external data signal into the memory cell activated by the row selection circuit via the bit line pair selected by the column selection circuit. Therefore, this semiconductor memory device, in the testing mode, performs a writing operation without having a writing latency, so that the testing time is short even if the test is carried out at a low frequency.

Preferably, the semiconductor memory device has two memory arrays, receives two external data signals consecutively input in synchronization with a leading edge and a trailing edge contained in the external clock signal, and receives an external data strobe signal having a leading edge and a trailing edge that are synchronized with the two external data signals. The row selection circuit selects a word line for each memory array, and the column selection circuit selects a bit line pair for each memory array. The writing circuit takes in the two external data signals in response to the leading edge and the trailing edge of the external data output signal, writes one of the two external data signals into the memory cells of one of the two memory arrays, and writes the other external data signal into the memory cells of the other memory array. In this case, since the external data signal are taken in in synchronization with both the leading edge and the trailing edge of the external clock signal, the writing operation can be carried out at a higher speed.

Preferably, the writing circuit includes an input buffer that, in the normal operation mode, is activated in response to the active command being issued and, in the testing mode, is activated at all times, to generate an internal data signal in accordance with the external data signal; first and second latch circuits that are respectively disposed in correspondence with the two memory arrays; and a first switching circuit that gives the internal data signal generated in the input buffer to the first latch circuit in response to the leading edge of the external data strobe signal, and gives the internal data signal generated in the input buffer to the second latch circuit in response to the trailing edge of the external data strobe signal. In this case, since the input buffer is activated at all times in the testing mode, the external data signal can be input before the active command. Further, the first and second latch circuits and the first switching circuit can convert the two serial internal data signals into two parallel internal data signals.

Preferably, the semiconductor memory device further includes a precharging circuit that precharges each bit line pair to a predetermined potential in response to a precharging command; and a first signal generating circuit that, in the normal operation mode, takes in a memory array selection signal contained in the external address signal in response to the writing command being issued and, in the testing mode, takes in the memory array selection signal in response to the precharging command being issued, to output first and second signals in accordance with the memory array selection signal. The writing circuit further includes third and fourth latch circuits that are respectively disposed in correspondence with the two memory arrays; and a second switching circuit that gives the internal data signals output from the first and second latch circuits respectively to the third and fourth latch circuits when the first signal is output from the first signal generating circuit, and gives the internal data signals output from the first and second latch circuits respectively to the fourth and third latch circuits when the second signal is output from the first signal generating circuit. In this case, since the memory array selection signal is taken in in response to the precharging command that is input before the active command and the writing command in the testing mode, the writing operation without having a writing latency can be carried out easily.

Preferably, the semiconductor memory device further includes a precharging circuit that precharges each bit line pair to a predetermined potential in response to a precharging command; and a first signal generating circuit that, in the normal operation mode, receives a memory array selection signal contained in the external address signal in response to the writing command being issued, to output a first or second signal in accordance with the memory array selection signal and, in the testing mode, outputs a preselected one of the first and second signals. The writing circuit further includes third and fourth latch circuits that are respectively disposed in correspondence with the two memory arrays; and a second switching circuit that gives the internal data signals output from the first and second latch circuits respectively to the third and fourth latch circuits when the first signal is output from the first signal generating circuit, and gives the internal data signals output from the first and second latch circuits respectively to the fourth and third latch circuits when the second signal is output from the first signal generating circuit. In this case, since there is no need to take in the memory array selection signal in the testing mode, the writing operation without having a writing latency can be carried out more easily.

Preferably, the semiconductor memory device further includes a second signal generating circuit that, in the normal operation mode, outputs a third signal when a predetermined second period of time passes after the writing command is issued and, in the testing mode, outputs the third signal in response to the writing command. The writing circuit further includes a third switching circuit for giving the internal data signals output from the third and fourth latch circuits respectively to the selected memory cells of the two memory arrays in response to the third signal being output from the second signal generating circuit. In this case, the writing operation having a writing latency can be carried out in the normal operation mode, and the writing operation without having a writing latency can be easily carried out in the testing mode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
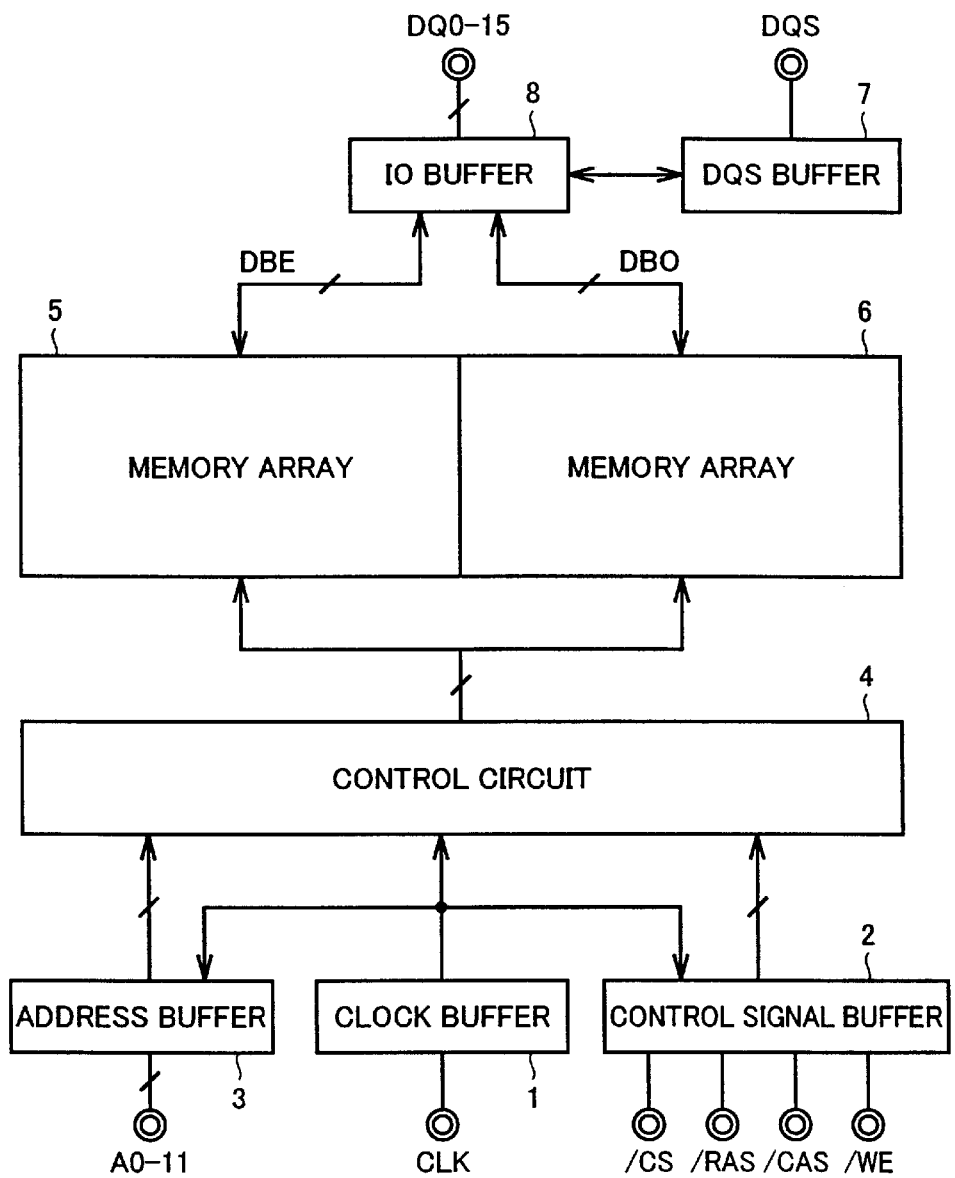
FIG. 1 is a block diagram illustrating an overall construction of a DDR SDRAM according to one embodiment of the present invention.

FIG. 1 is a block diagram illustrating an overall construction of a DDR SDRAM according to one embodiment of the present invention. Referring to FIG. 1, this DDR SDRAM is provided with a dock buffer 1, a control signal buffer 2, an address buffer 3, a control circuit 4, two memory arrays 5, 6, a DQS buffer 7, and an IO buffer 8.

Clock buffer 1 transmits an external clock signal CLK to control signal buffer 2, address buffer 3, and control circuit 4. Control signal buffer 2 latches external control signals /CS, /RAS, /CAS, /WE in synchronization with external clock signal CLK from clock buffer 1 and gives external control signals /CS, /RAS, /CAS, /WE to control circuit 4. Address buffer 3 latches external address signals A0 to A11 in synchronization with external clock signal CLK from clock buffer 1 and gives external address signals A0 to A11 to control circuit 4.

Each of memory arrays 5, 6 includes a plurality of memory cells. The plurality of memory cells are arranged in a matrix form. Each memory cell stores a one-bit data. The plurality of memory cells are grouped in advance into groups each containing 16 memory cells.

Control circuit 4 generates various kinds of internal control signals in accordance with signals from clock buffer 1, control signal buffer 2, and address buffer 3, and controls the entire SDRAM. Control circuit 4 selects sixteen memory cells in each of the two memory arrays 5, 6 in accordance with the external address signals A0 to A11 in the writing operation mode and in the reading operation mode. The thirty-two memory cells selected from memory arrays 5, 6 are joined with IO buffer 8 via data buses DBE, DBO.

DQS buffer 7 gives an external data strobe signal DQS to IO buffer 8 in the writing operation mode, and outputs the data strobe signal DQS from IO buffer 8 to the outside in the reading operation mode. In the writing operation mode, IO buffer 8 converts two sets of data D0 to D15, which have been consecutively input in synchronization with a rising edge and a falling edge of external data strobe signal DQS, into thirty-two parallel data, and gives the converted data to the thirty-two memory cells of the memory arrays 5, 6. In the reading operation mode, IO buffer 8 converts the data read out from the thirty-two memory cells of memory arrays 5, 6 into two sets of serial data Q0 to Q15, and outputs the converted data to the outside together with the rising edge and the falling edge of the data strobe signal DQS.

Figure 2:
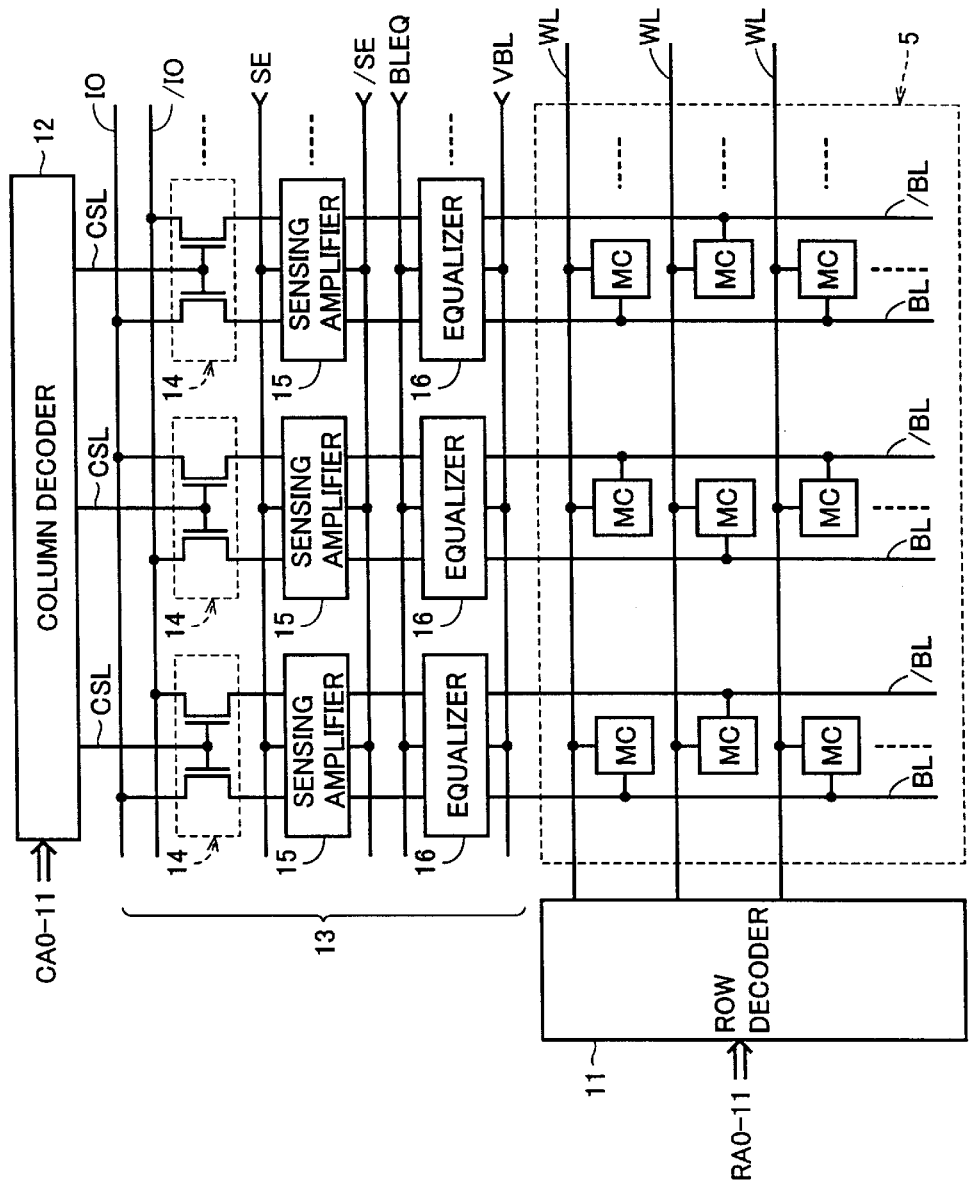
FIG. 2 is a circuit diagram illustrating a construction of a memory array shown in FIG. 1 and its related part.

FIG. 2 is a circuit block diagram illustrating a construction of a part of memory array 5 shown in FIG. 1, which corresponds to one data signal DQ0, and the part associated therewith. Referring to FIG. 2, memory array 5 includes a plurality of memory cells MC arranged in a matrix form, a word line WL disposed in correspondence with each row, and a bit line pair BL, /BL disposed in correspondence with each column. Memory cell MC is known one including an N-channel MOS transistor for accessing and a capacitor for storing information.

A row decoder 11, a column decoder 12, and a sensing amplifier+input/output control circuit 13 are disposed in correspondence with memory array 5. Sensing amplifier+ input/output control circuit 13 includes a data input/output line pair IO, /IO and a column selection gate 14, a sensing amplifier 15, and an equalizer 16 which are disposed in correspondence with each column of memory array 5.

Column selection gate 14 includes a pair of N-channel MOS transistors connected between the bit line pair BL, /BL of the corresponding column and the data input/output line pair IO, /IO. The gate of each N-channel MOS transistor is connected to column decoder 12 via the corresponding column selection line CSL. When the column selection line CSL is raised to "H" level, which is a selected level, by column decoder 12, the N-channel MOS transistor becomes conducted to join the bit line pair BL, /BL with data input/output line pair IO, /IO.

Sensing amplifier 15 amplifies a minute potential difference between the bit line pair BL, /BL to a power source voltage VCC in response to sensing amplifier activating signals SE, /SE being respectively brought to "H" level and "L" level. Equalizer 16 equalizes the potential of the bit lines BL, /BL with a bit line precharging potential VBL in response to a bit line equalizing signal BLEQ being brought to "H" level, which is an activated level.

Row decoder 11 raises one word line WL out of the plural word lines WL to "H" level, which is a selected level, in accordance with row address signals RA0 to RA11 (external address signals A0 to A11 when the external control signal /RAS is at "L" level). Column decoder 12 raises one column selection line CSL out of the plural column selection lines CSL to "H" level, which is a selected level, in accordance with column address signals CA0 to CA11 (external address signals A0 to A11 when the external control signal /CAS is at "L" level). The other memory array 6 has the same construction as memory array 5.

Next, an operation of the SDRAM shown in FIGS. 1 and 2 will be described. However, for simplifying the description, only the writing/reading of one data signal DQ0 in one memory array 5 will be described.

In the reading mode, first the bit line equalizing signal BLEQ falls to "L" level to stop the equalization of bit line pair BL, /BL. Next, word line WL of the row corresponding to row address signals RA0 to RA11 is raised to "H" level, which is a selected level, by row decoder 11 to let the N-channel MOS transistors of the memory cells MC of the row become conducted. This changes the potential difference between the bit line pair BL, /BL by a minute amount in accordance with the amount of electric charge in the capacitor of the activated memory cell MC.

Subsequently, sensing amplifier activation signals SE, /SE are set to be at "H" level and "L" level, respectively to activate sensing amplifier 15. When the potential of bit line BL is higher by a minute amount than the potential of bit line /BL, the potential of bit line BL is raised to "H" level, and the potential of bit line /BL is lowered to "L" level. Conversely, when the potential of bit line /BL is higher by a minute amount than the potential of bit line BL, the potential of bit line /BL is raised to "H" level, and the potential of bit line BL is lowered to "L" level.

Next, column selection line CSL of the column corresponding to column address signals CA0 to CA11 is raised to "H" level, which is a selected level, by column decoder 12 to let column selection gate 14 of the column become conducted. The data of the selected bit line pair BL, /BL are given to IO buffer 8 via column selection gate 14, data input/output line pair IO, /IO, and data bus DBE. IO buffer 8 outputs the read data signal Q0 to the outside in synchronization with the rising edge or the falling edge of data strobe signal DQS.

In the writing mode, in the same manner as in the reading mode, the equalization of bit line pair BL, /BL is stopped, and word line WL of the row corresponding to row address signals RA0 to RA11 is raised to "H" level, which is a selected level, to activate sensing amplifier 15.

Next, column selection gate 14 of the column corresponding to column address signals CA0 to CA11 becomes conducted, and the selected bit line pair BL, /BL is connected to IO buffer 8 via data input/output line pair IO, /IO and data bus DBE. IO buffer 8 takes in external data signal D0 in synchronization with the rising edge or the falling edge of data strobe signal DQS, and gives the data signal D0 to the bit line pair BL, /BL of the selected column via data bus DBE and data input/output line pair IO, /IO. Writing data signal D0 is given as the potential difference between the bit line pair BL, /BL. The capacitor of selected memory cell MC is given an electric charge of an amount corresponding to the potential of bit line BL or /BL.

Hereafter, the writing control method characterizing this DDR SDRAM will be described in detail. This DDR SDRAM performs a writing operation having a writing latency in the normal operation mode in the same manner as in a conventional one, but performs a writing operation without having a writing latency in the testing mode that uses a low frequency.

Figure 3:
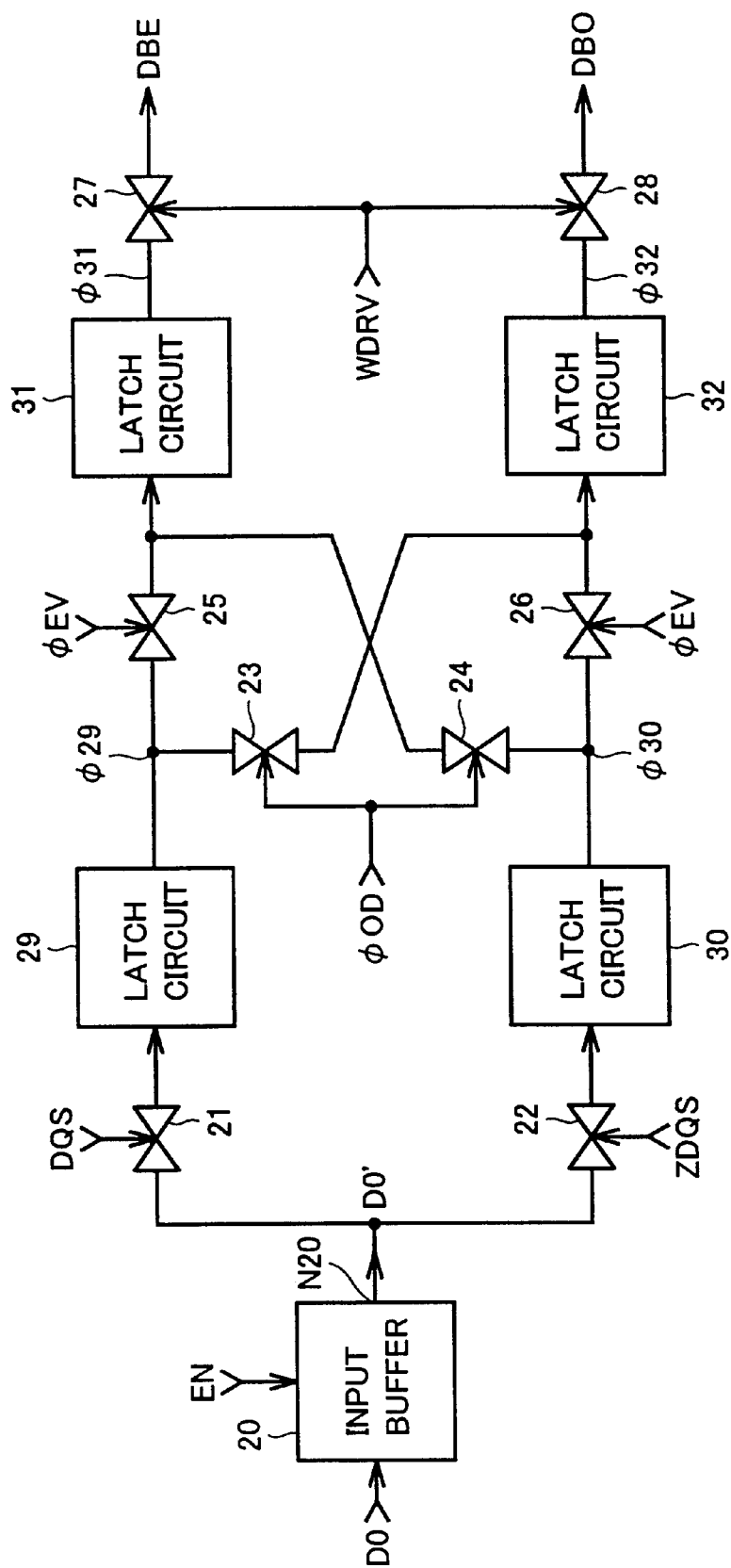
FIG. 3 is a circuit diagram illustrating an essential part of an IO buffer shown in FIG. 1.

FIG. 3 is a circuit block diagram illustrating a part of IO buffer 8 included in this DDR SDRAM, which is associated with the writing operation of one data signal D0. Referring to FIG. 3, this IO buffer 8 includes an input buffer 20, transfer gates 21 to 28, and latch circuits 29 to 32.

Figure 4:
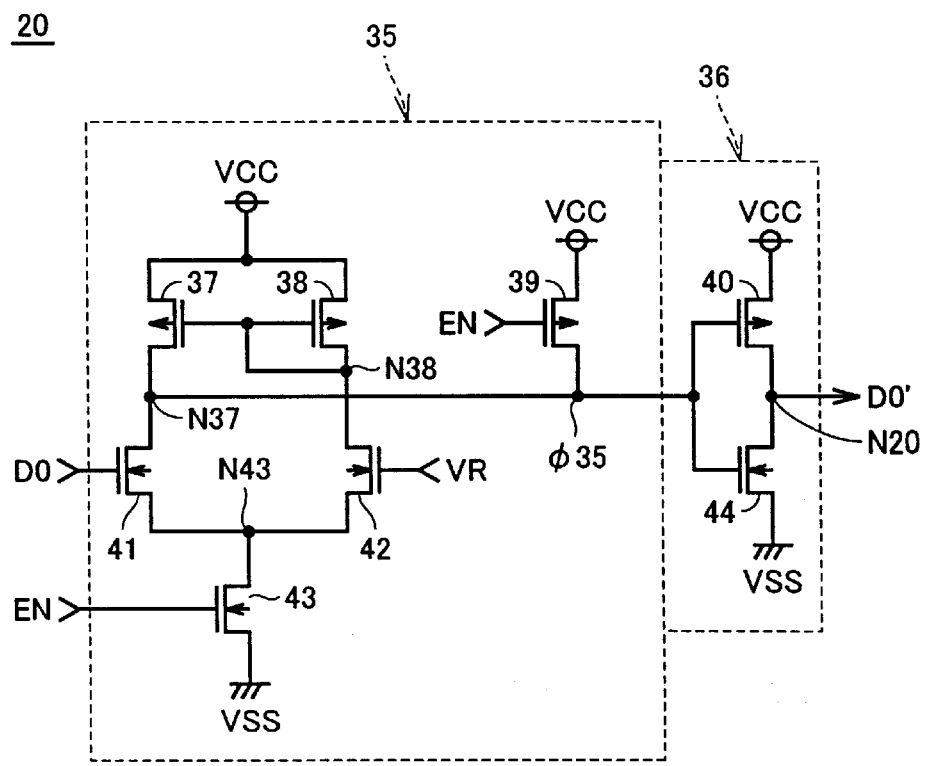
FIG. 4 is a circuit diagram illustrating a construction of an input buffer shown in FIG. 3.

Referring to FIG. 4, input buffer 20 includes a comparator 35 and an inverter 36. Comparator 35 includes P-channel MOS transistors 37 to 39 and N-channel MOS transistors 41 to 43. P-channel MOS transistors 37, 38 are connected respectively between the line of power source potential VCC and nodes N37, N38, and the gates of P-channel MOS transistors 37, 38 are both connected to node N38. P-channel MOS transistors 37, 38 constitute a current mirror circuit. N-channel MOS transistors 41, 42 are connected respectively between nodes N37, N38 and node N43, and the gates of N-channel MOS transistors 41, 42 respectively receive external data signal D0 and reference potential VR. N-channel MOS transistor 43 is connected between node N43 and the line of ground potential VSS, and the gate of N-channel MOS transistor 43 receives an activating signal EN. P-channel MOS transistor 39 is connected between the line of power source potential VCC and node N37, and the gate of P-channel MOS transistor 39 receives activating signal EN. The signal appearing at node N37 becomes an output signal φ35 of comparator 35.

When activating signal EN is at "L" level, which is a non-activated level, N-channel MOS transistor 43 becomes non-conducted and P-channel MOS transistor 39 becomes conducted, whereby comparator 35 is made non-activated and output signal φ35 of comparator 35 is fixed at "H" level. When activating signal EN is at "H" level, which is an activated level, N-channel MOS transistor 43 becomes conducted and P-channel MOS transistor 39 becomes non-conducted, whereby comparator 35 is activated.

Since N-channel MOS transistor 42 and P-channel MOS transistor 38 are connected in series and P-channel MOS transistors 38 and 37 constitute a current mirror circuit, the currents of the same value flow through MOS transistors 42, 38, and 37. When the level of external data signal D0 is lower than reference potential VR, the electric current that flows through N-channel MOS transistor 41 becomes smaller than the electric current that flows through P-channel MOS transistor 37, whereby signal φ35 is brought to "H" level. When the level of external data signal D0 is higher than reference potential VR, the electric current that flows through N-channel MOS transistor 41 becomes larger than the electric current that flows through P-channel MOS transistor 37, whereby signal φ35 is brought to "L" level.

Inverter 36 includes a P-channel MOS transistor 40 and an N-channel MOS transistor 41. P-channel MOS transistor 40 is connected between the line of power source potential VCC and output node N20, and the gate of P-channel MOS transistor 40 receives output signal φ35 of comparator 35. N-channel MOS transistor 44 is connected between output node N20 and the line of ground potential VSS, and the gate of N-channel MOS transistor 44 receives signal φ35. Signal D0' appearing at output node N20 becomes output signal D0' of input buffer 20.

When output signal φ35 of comparator 35 is at "H" level, P-channel MOS transistor 40 becomes non-conducted, and N-channel MOS transistor 44 becomes conducted to set external data signal D0' at "L" level. When output signal φ35 of comparator 35 is at "L" level, P-channel MOS transistor 40 becomes conducted, and N-channel MOS transistor 44 becomes non-conducted to set external data signal D0' at "H" level.

Figure 5:
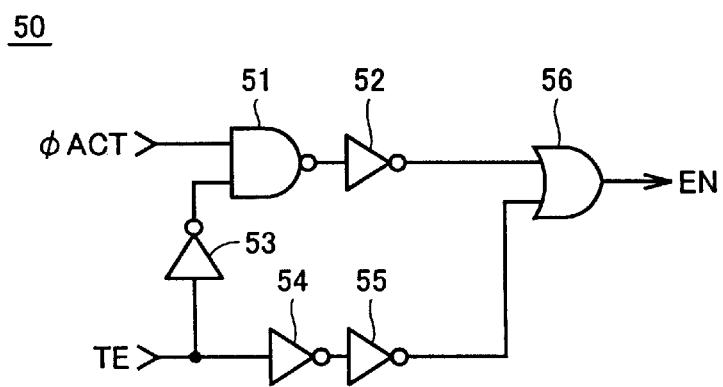
FIG. 5 is a circuit diagram illustrating a construction of a signal generating circuit for generating an activating signal EN shown in FIG. 4.

FIG. 5 is a circuit diagram illustrating a construction of a signal generating circuit 50 that generates an activating signal EN shown in FIG. 4. Referring to FIG. 5, signal generating circuit 5 includes a NAND gate 51, inverters 52 to 55, and an OR gate 56. Active signal φACT is a signal that is set at "H" level, which is an activated level, at the time of activation, and is input into one input node of NAND gate 51. Test signal TE is a signal that is set at "H" level, which is an activated level, at the time of test, and is input into the other input node of NAND gate 51 via inverter 53, and is input into one input node of OR gate 56 via inverters 54, 55. The output signal of NAND gate 56 is input into the other input node of OR gate 56 via inverter 52. The output signal of OR gate 56 becomes an activating signal EN.

In the normal operation mode, test signal TE is set at "L" level, which is a non-activated level. In this case, active signal φACT passes NAND gate 51, inverter 52, and OR gate 56 to become activating signal EN. At the standby time when active signal φACT is at "L" level, activating signal EN is at "L" level, and at the active time when active signal φACT is at "H" level, activating signal EN is at "H" level. In the testing mode, test signal TE is set at "H" level, which is an activated level. In this case, test signal TE passes inverters 54, 55 and OR gate 56 to become activating signal EN. Therefore, in the testing mode when test signal TE is at "H" level, activating signal EN is at "H" level, which is an activated level, and input buffer 20 is activated even if active command ACT is not input.

Returning to FIG. 3, transfer gate 21 receives an output signal D0' of input buffer 20, and becomes pulsewise conducted in response to the rising edge of data strobe signal DQS to give the signal D0' to latch circuit 29. Transfer gate 22 receives an output signal D0' of input buffer 20, and becomes pulsewise conducted in response to the failing edge of data strobe signal DQS (i.e. the rising edge of signal ZDQS which is an inverted signal of data strobe signal DQS) to give the signal D0' to latch circuit 30. Latch circuits 29, 30 hold and output the signal that has been given from input buffer 20 via transfer gates 21, 22.

Transfer gate 23 receives an output signal φ29 of latch circuit 29 and, when signal φOD is at "H" level, transfer gate 23 becomes conducted to give the signal φ29 to latch circuit 32. Transfer gate 24 receives an output signal φ30 of latch circuit 30 and, when signal φOD is at "H" level, transfer gate 24 becomes conducted to give the signal φ30 to latch circuit 31. Transfer gate 25 receives an output signal φ29 of latch circuit 29 and, when signal φEV is at "H" level, transfer gate 25 becomes conducted to give the signal φ29 to latch circuit 31. Transfer gate 26 receives an output signal φ30 of latch circuit 30 and, when signal φEV is at "H" level, transfer gate 26 becomes conducted to give the signal φ30 to latch circuit 32.

Latch circuit 31 holds and outputs the signal that is given from latch circuit 29 or 30 via transfer gate 25 or 24. Latch circuit 32 holds and outputs the signal that is given from latch circuit 30 or 29 via transfer gate 26 or 23. Transfer gate 27 receives an output signal φ31 of latch circuit 31 and, when signal WDRV is at "H" level, transfer gate 27 becomes conducted to give the signal φ31 to memory array 5 via data bus DBE. Transfer gate 28 receives an output signal φ32 of latch circuit 32 and, when signal WDRV is at "H" level, transfer gate 28 becomes conducted to give the signal φ32 to memory array 6 via data bus DBO.

Figure 6:
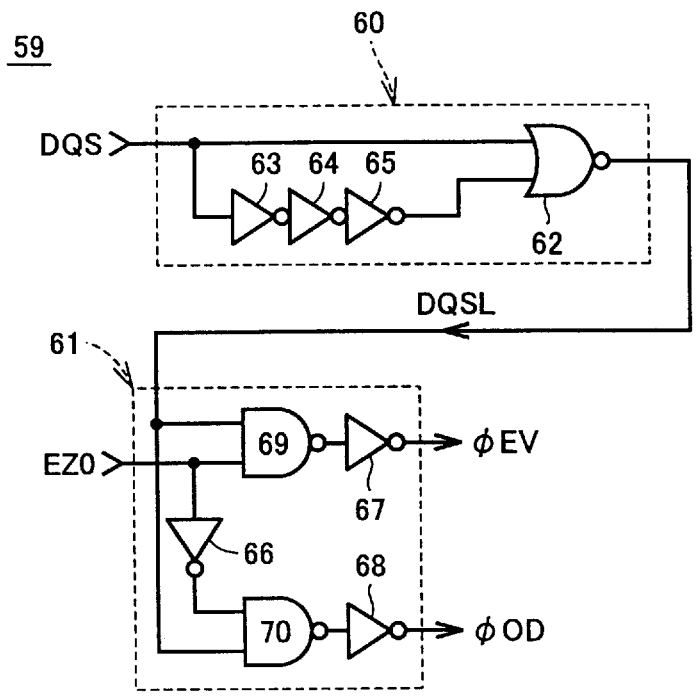
FIG. 6 is a circuit diagram illustrating a construction of a signal generating circuit for generating signals φEV and φOD shown in FIG. 3.

FIG. 6 is a circuit diagram illustrating a construction of a signal generating circuit 59 for generating the signals φEV, φOD shown in FIG. 3. Referring to FIG. 6, this signal generating circuit 59 includes a pulse generating circuit 50 and a gate circuit 61. Pulse generating circuit 60 includes a NOR gate 62 and inverters 63 to 65. External data strobe signal DQS is input directly into one input node of NOR gate 62, and input into the other input node of NOR gate 62 via inverters 63 to 65.

When signal DQS is at "H" level, one input node and the other input node of NOR gate 62 are brought to "H" level and "L" level, respectively, whereby output signal DQSL of NOR gate 62 is brought to "L" level. When signal DQS falls to "L" level, one input node and the other input node of NOR gate 62 are both brought to "L" level, whereby signal DQSL is brought to "H" level. After the delay time of inverters 63 to 65 has passed, one input node and the other input node of NOR gate 62 are brought to "L" level and "H" level, respectively, whereby signal DQSL is brought to "L" level. Therefore, signal DQSL is pulsewise set at "H" level for the delay time of inverters 63 to 65 in response to signal DQS being lowered from "H" level to "L" level.

Gate circuit 61 includes inverters 66 to 68 and NAND gates 69, 70. Output signal DQSL of pulse generating circuit 60 is input into one input node of NAND gates 69, 70. Signal EZ0 is input directly into the other input node of NAND gate 69, and is input into the other input node of NAND gate 70 via inverter 66. The output signal of NAND gate 69 is inverted by inverter 67 to become signal φEV, and the output signal of NAND gate 70 is inverted by inverter 68 to become signal φOD.

When signal EZ0 is at "H" level, φEV is pulsewise set at "H" level in response to signal DQSL being pulsewise set at "H" level, while signal φOD is fixed at "L" level. When signal EZ0 is at "L" level, φOD is pulsewise set at "H" level in response to signal DQSL being pulsewise set at "H" level, while signal φEV is fixed at "L" level.

Figure 7:
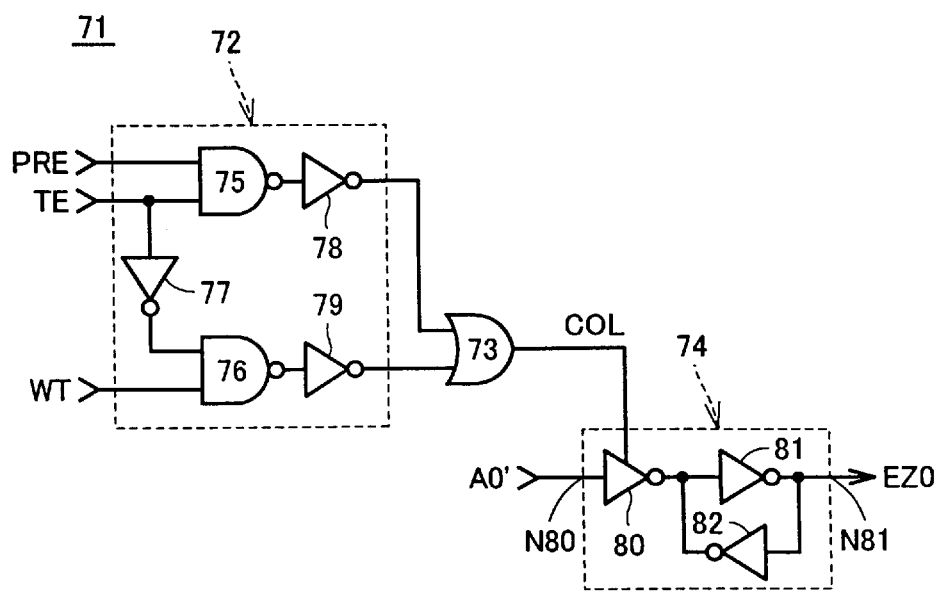
FIG. 7 is a circuit diagram illustrating a construction of a signal generating circuit for generating a signal EZ0 shown in FIG. 6.

FIG. 7 is a circuit diagram illustrating a construction of a signal generating circuit 71 for generating the signal EZ0 shown in FIG. 6. Referring to FIG. 7, signal generating circuit 71 includes a gate circuit 72, an OR gate 73, and a latch circuit 74. Gate circuit 72 includes NAND gates 75, 76 and inverters 77 to 79. Signals PRE, WT are input into one input node of NAND gates 75, 76, respectively. Signals PRE and WT are signals that are pulsewise set at "H" level in response to precharging command PCG and writing command WRT being input, respectively. Test signal TE is input directly into the other input node of NAND gate 75, and is input into the other input node of NAND gate 76 via inverter 77. The output signals of NAND gates 78, 79 are inverted respectively by inverters 78, 79 to be input into OR gate 73.

When test signal TE is at "L" level, which is a non-activated level, the output signal of inverter 78 is fixed at "L" level, and signal WT passes NAND gate 76 and inverter 79 to be input into OR gate 73. When test signal TE is at "H" level, which is an activated level, the output signal of inverter 79 is fixed at "L" level, and signal PRE passes NAND gates 75 and inverter 78 to be input into OR gate 73.

Latch circuit 74 includes a clocked inverter 80 and inverters 81, 82. Clocked inverter 80 and inverter 81 are connected in series between input node N80 and output node N81, and inverter 82 is connected inversely in parallel with inverter 81. An internal address signal A0' is given to input node N80. An output signal COL of OR gate 73 is given to the control node of clocked inverter 80. The signal appearing at output node N81 becomes signal EZ0. Therefore, the level of internal address signal A0 when output signal COL of OR gate 73 is at "H" level is latched by latch circuit 74 to become signal EZ0.

Figure 8:
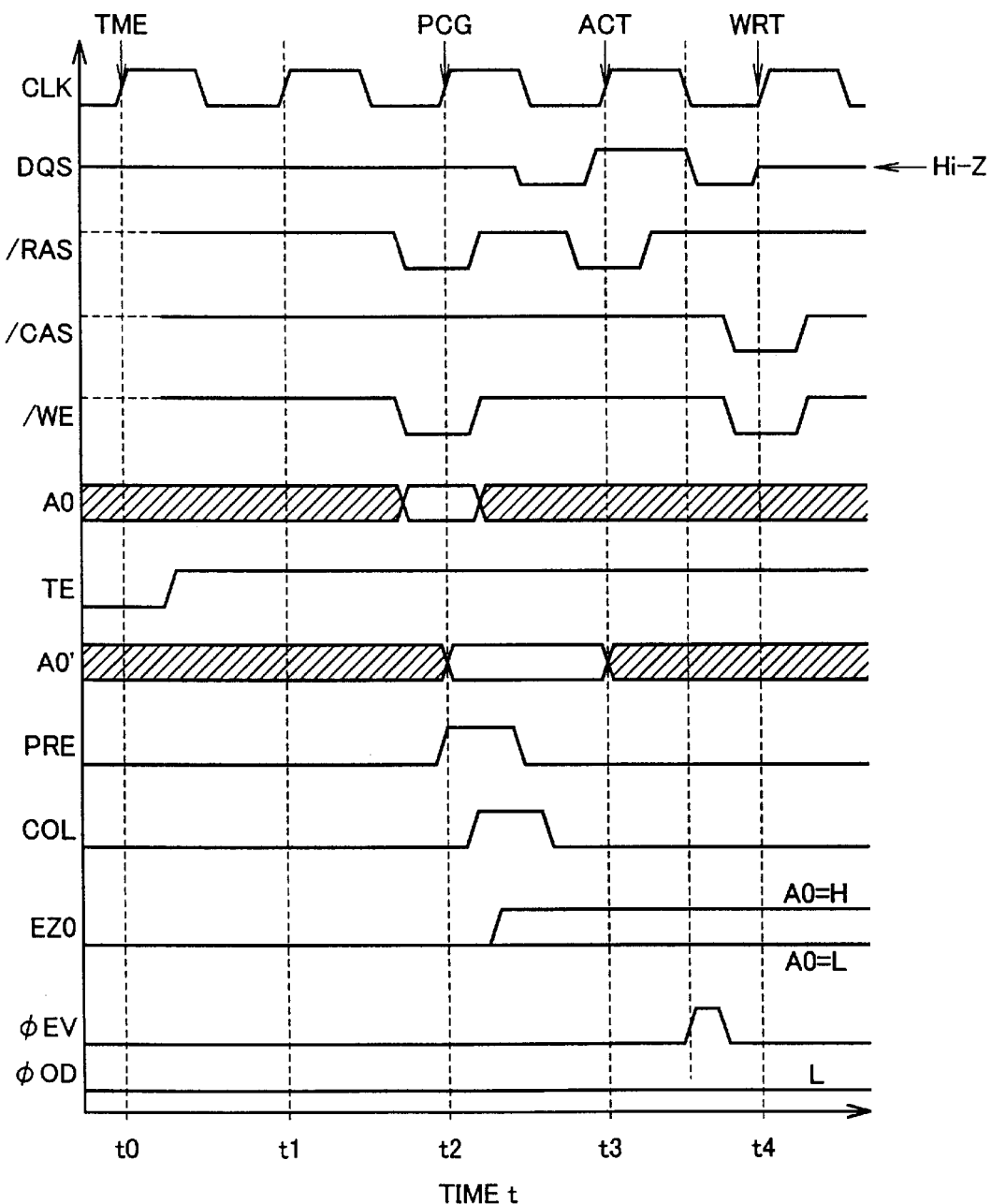
FIG. 8 is a time chart showing operations of the signal generating circuits shown in FIGS. 6 and 7 in the testing mode.

FIG. 8 is a time chart showing an operation of signal generating circuits 59, 71 shown in FIGS. 6 and 7 in the testing mode. Referring to FIG. 8, a test command TME is input at the rising edge of clock signal CLK at a certain time t0 to raise test signal TE to "H" level, which is an activated level. Test command TME is input, for example, by inputting signals /CS, /RAS, /CAS, /WE at a timing of so-called WCBR and inputting a so-called address key.

Next, at the rising edge of clock signal CLK at the time t2 when two clock cycles have passed since time t0, a precharging command PCG (/CS=L, /RAS=L, /CAS=H, /WE=L) is input, and external address signal A0 at the time of input is latched to generate an internal address signal A0', and signal PRE is pulsewise raised to "H" level. Signal PRE passes through NAND gate 75, inverter 78, and OR gate 73 of FIG. 7 to become a signal COL. When signal COL is pulsewise raised to "H" level, internal address signal A0' is latched by latch circuit 74 to generate a signal EZ0. Also, bit line equalizing signal BLEQ of FIG. 2 is set at "H" level, which is an activated level, to activate equalizer 16, whereby each bit line pair BL, /BL is precharged to bit line precharging potential VBL.

Next, at the rising edge of clock signal CLK at time t3 when one clock cycle has passed since time t2, an active command ACT (/CS=L, /RAS=L, /CAS=H, /WE=H) is input, and address signals A0 to A11 at that time are taken in as row address signals RA0 to RA1.

In response thereto, equalizer 16 is made non-activated to stop the equalization of bit lines BL, /BL, and word line WL of the row corresponding to row address signals RA0 to RA11 is raised to "H" level, which is a selected level, by row decoder 11, whereby memory cell MC is activated and sensing amplifier 15 is activated.

Also, in synchronization with the rising edge and the subsequent falling edge of clock signal CLK at time t3, the rising edge and the falling edge of external data strobe signal DQS are input, respectively. In response to the falling edge of external data strobe signal DQS, pulse generating circuit 60 of FIG. 6 raises signal DQSL pulsewise to "H" level and, for example, signal φEV is pulsewise raised to "H" level. When signal φEV is raised to "H" level, transfer gates 25, 26 of FIG. 3 become conducted to give output signals φ29, φ30 of latch circuits 29, 30 to latch circuits 31, 32 via transfer gates 25, 26, respectively.

Figure 9:
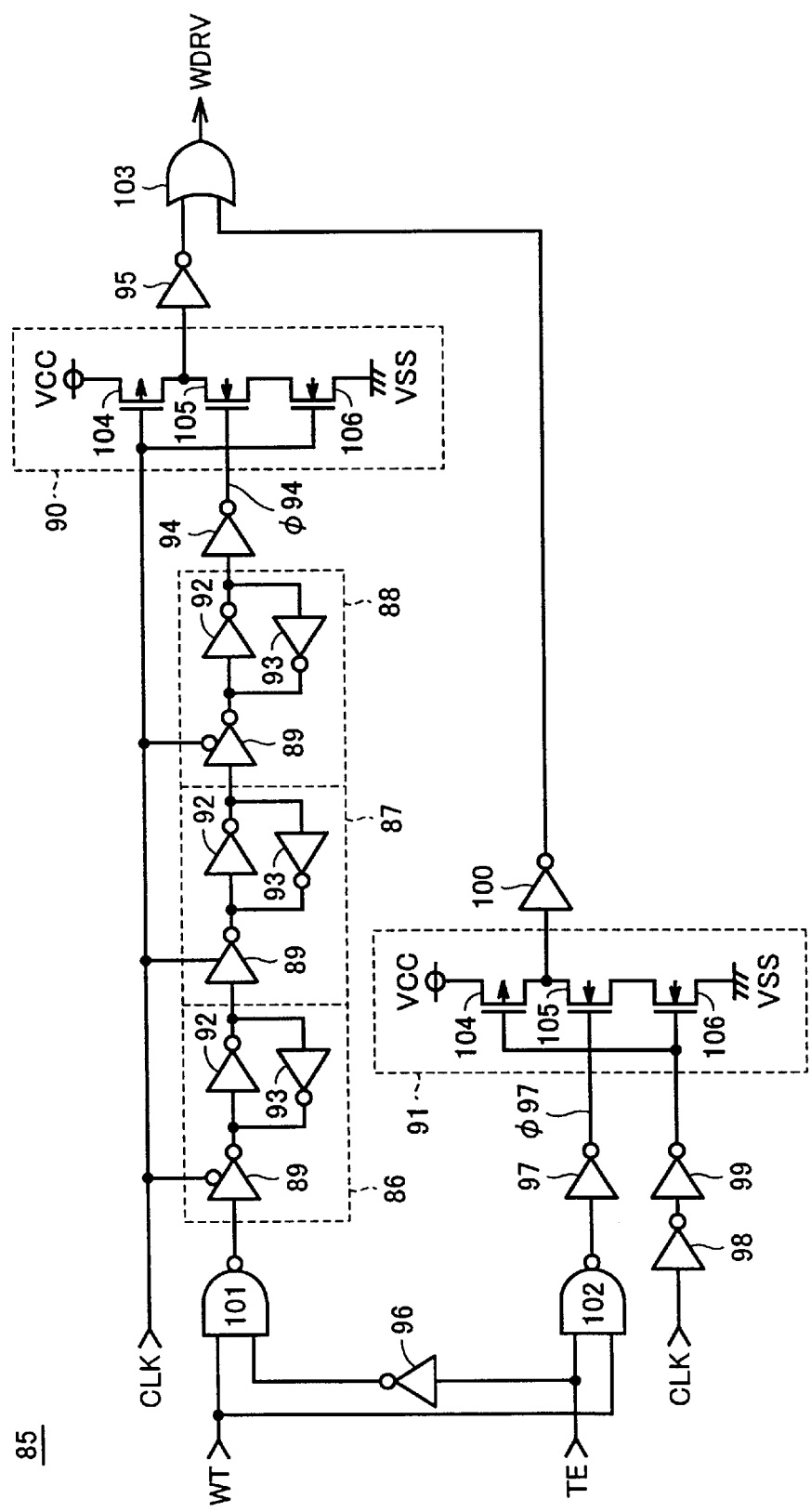
FIG. 9 is a circuit diagram illustrating a construction of a signal generating circuit for generating a signal WDRV shown in FIG. 3.

FIG. 9 is a circuit diagram illustrating a construction of a signal generating circuit 85 for generating the signal WDRV of FIG. 3. Referring to FIG. 9, this signal generating circuit 85 includes latch circuits 86 to 88, clocked inverters 90, 91, inverters 94 to 100, NAND gates 101, 102, and an OR gate 103. Signal WT is input into one input node of NAND gates 101, 102. Test signal TE is input directly into the other input node of NAND gate 102, and is input into the other input node of NAND gate 101 via inverter 96. The output signal of NAND gate 101 is input into a control node of clocked inverter 90 via latch circuits 86 to 88 and inverter 94.

Each of latch circuits 86 to 88 includes a clocked inverter 89 for receiving an input signal in synchronization with clock signal CLK, and a pair of inverters 92, 93 for holding and outputting the signal received by clocked inverter 89. Each of latch circuits 86, 88 receives the input signal in the period when clock signal CLK is at "L" level, and the received signal is held and output in response to clock signal CLK being raised from "L" level to "H" level. Latch circuit 87 receives the input signal in the period when clock signal CLK is at "H" level, and the received signal is held and output in response to clock signal CLK being lowered from "H" level to "L" level.

Clocked inverter 90 includes a P-channel MOS transistor 104 and N-channel MOS transistors 105, 106 connected in series between the line of power source potential VCC and the line of ground potential VSS. The gates (input nodes) of MOS transistors 104, 106 receive clock signal CLK, and the gate (control node) of MOS transistor 105 receives an output signal φ94 of inverter 94. When signal φ94 is at "L" level, N-channel MOS transistor 105 becomes non-conducted to make clocked inverter 90 nonactivated, and the output signal of clocked inverter 90 is fixed at "H" level. When signal φ94 is at "H" level, N-channel MOS transistor 105 becomes conducted to activate clocked inverter 90, which in turn outputs an inverted signal of clock signal CLK. The output signal of clocked inverter 90 is input into one input node of OR gate 103 via inverter 95.

In the same manner as clocked inverter 90, clocked inverter 91 includes a P-channel MOS transistor 104 and N-channel MOS transistors 105, 106 connected in series between the line of power source potential VCC and the line of ground potential VSS. The output signal of NAND gate 102 is input into the control node of clocked inverter 91 (gate of MOS transistor 105) via inverter 97. Clock signal CLK is input into the input node of clocked inverter 91 (gates of MOS transistors 104, 106) via inverters 98, 99.

When output signal φ97 of inverter 97 is at "L" level, N-channel MOS transistor 105 becomes non-conducted to make clocked inverter 91 non-activated, and the output signal of clocked inverter 91 is fixed at "H" level. When signal φ97 is at "H" level, N-channel MOS transistor 105 becomes conducted to activate clocked inverter 91, which in turn outputs the inverted signal of clock signal CLK. The output signal of clocked inverter 91 is input into the other input node of OR gate 103 via inverter 100. The output signal of OR gate 103 becomes output signal WDRV of signal generating circuit 85.

Figure 10:
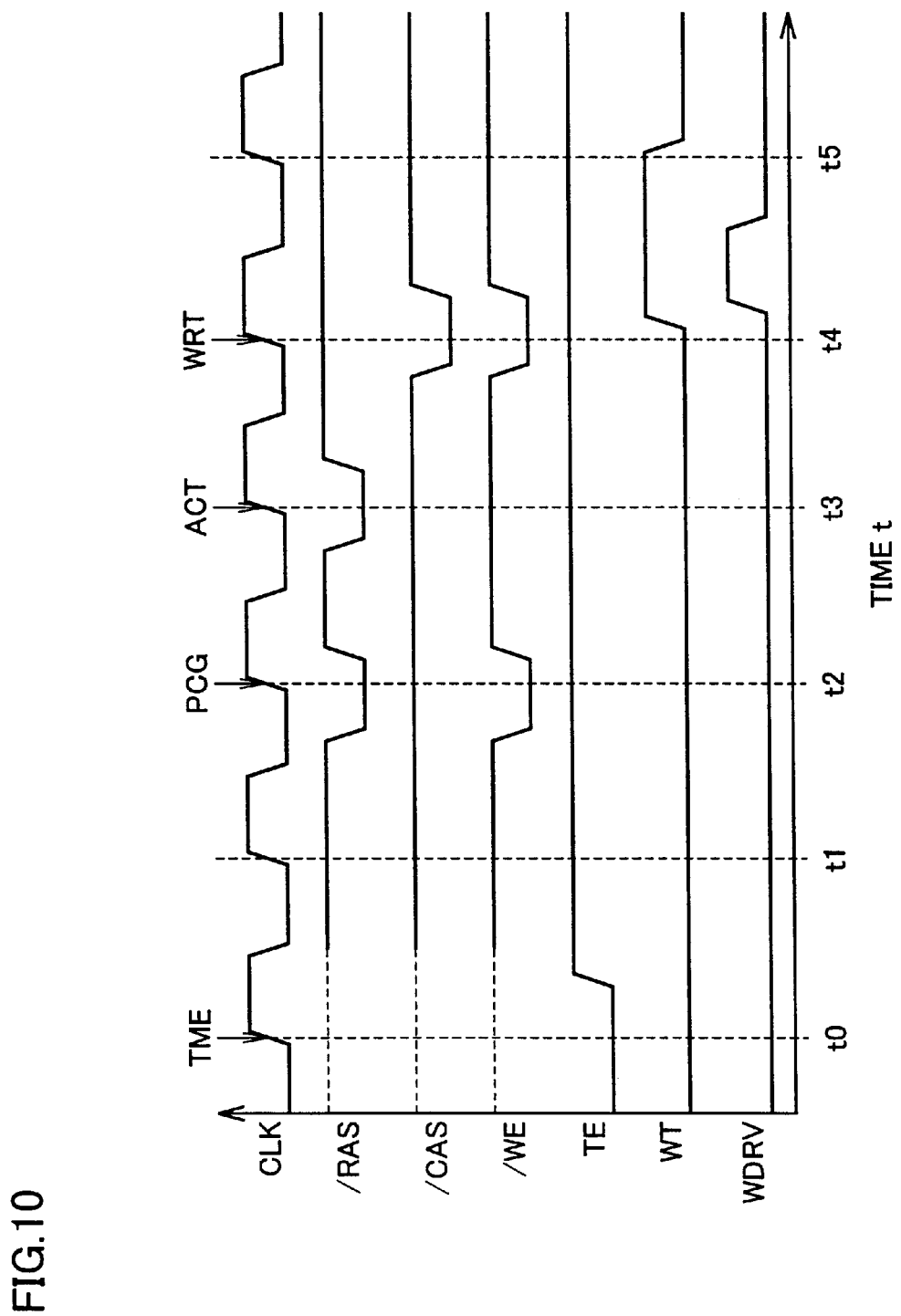
FIG. 10 is a time chart showing an operation of the signal generating circuit shown in FIG. 9 in the testing mode.

FIG. 10 is a time chart illustrating an operation of signal generating circuit 85 shown in FIG. 9 in the testing mode. Referring to FIG. 10, at the rising edge of clock signal CLK at a certain time t0, a test command TME is input to raise test signal TE to "H" level, which is an activated level. This fixes the output signal of NAND gate 101 at "H" level, fixes the output signal φ94 of inverter 94 at "L" level, and fixes the output signal of inverter 95 at "L" level. In the meantime, NAND gate 102 operates as an inverter to signal WT.

At the rising edge of clock signal CLK at time t4 when four clock cycles have passed since time t0, a writing command WRT is input to raise signal WT to "H" level for one clock cycle. When signal WT is set at "H" level, clocked inverter 91 is activated, and clock signal CLK passes inverters 98, 99, 91, 100 and OR gate 103 to become signal WDRV. Since signal WT is set at "H" level for one clock cycle, signal WDRV is set at "H" level for ½ clock cycle. Therefore, in the testing mode, signal WDRV is pulsewise raised to "H" level for ½ clock cycle in response to writing command WRT. When signal WDRV is set at "H" level, transfer gates 27, 28 of FIG. 3 become conducted to give the output signals φ31, φ32 of latch circuits 31, 32 to data buses DBE, DBO via transfer gates 27, 28.

Figure 11:
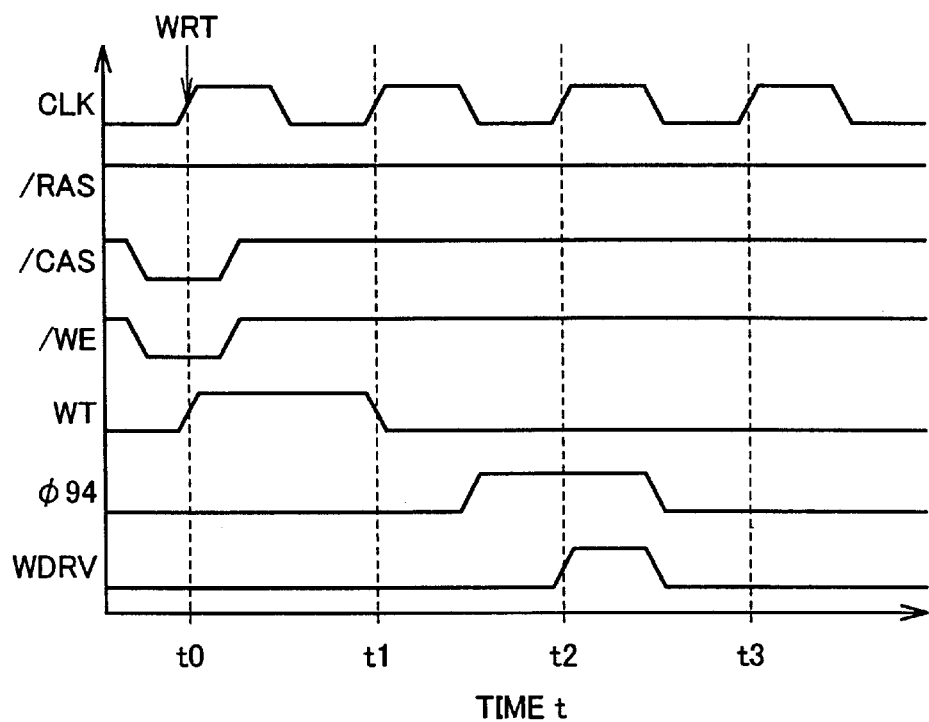
FIG. 11 is a time chart showing an operation of the signal generating circuit shown in FIG. 9 in the normal operation mode.

FIG. 11 is a time chart illustrating an operation of signal generating circuit 85 shown in FIG. 9 in the normal operation mode. In this case, test signal TE is fixed at "L" level; the output signal of NAND gate 102 of FIG. 9 is fixed at "H" level; and the output signal of inverter 100 is fixed at "L" level. In the meantime, NAND gate 101 operates as an inverter to signal WT.

At the rising edge of clock signal CLK at time t0, writing command WRT is input to raise signal WT to "H" level for one clock cycle. Signal WT is latched by latch circuit 86 in response to the falling edge of clock signal CLK, is latched by latch circuit 87 in response to the next rising edge, and is latched by latch circuit 88 in response to the further next falling edge. Therefore, the output signal φ94 of inverter 94 will be a signal obtained by delaying signal WT for 3/2 clock cycles, and signal WDRV is pulsewise raised to "H" level for ½ clock cycle at time t2 when two clock cycles have passed since time t0.

Figure 12:
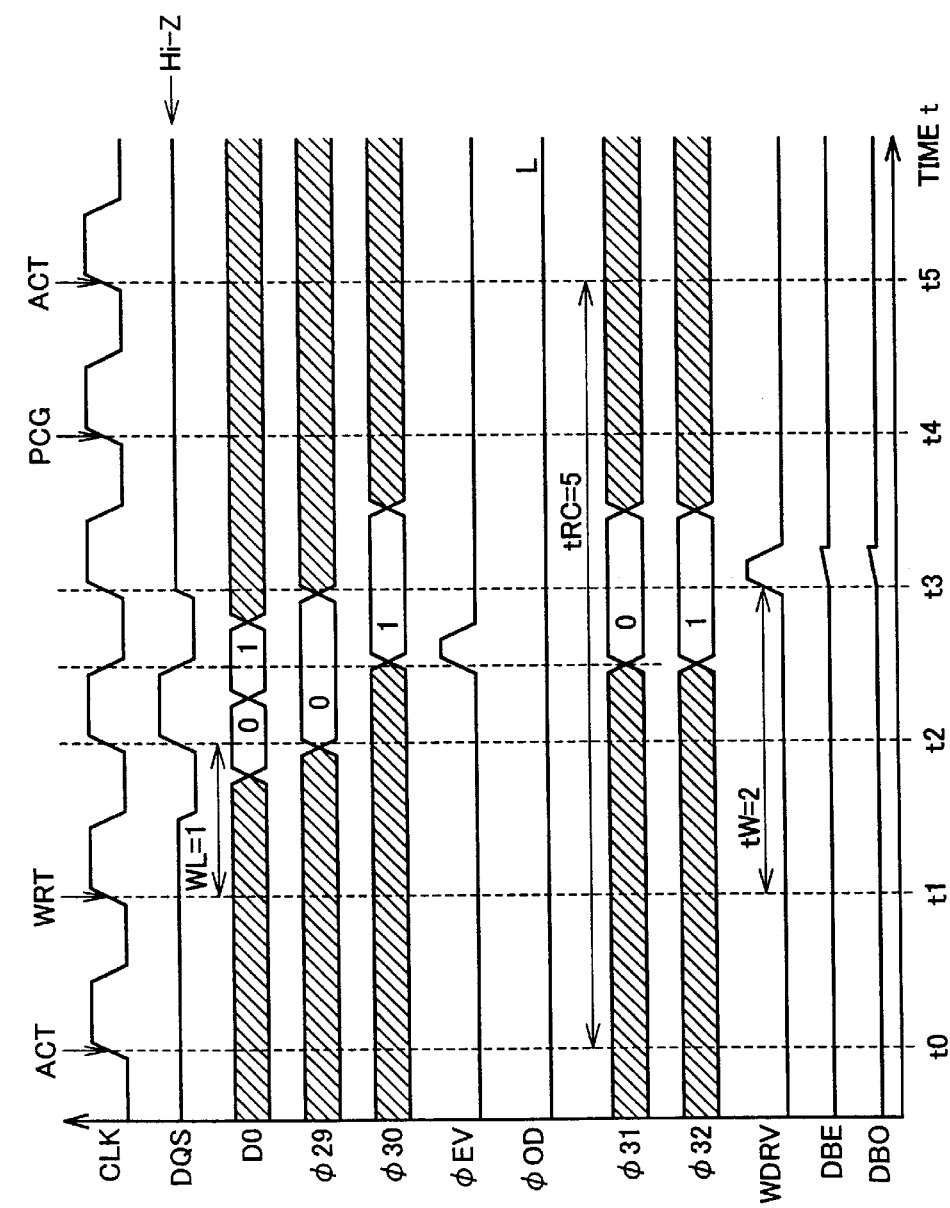
FIG. 12 is a time chart showing a writing operation of the DDR SDRAM shown in FIGS. 1 to 11 in the normal operation mode.

FIG. 12 is a time chart illustrating a writing operation of the DDR SDRAM shown in FIGS. 1 to 11 in the normal operation mode. Referring to FIG. 12, at the rising edge of clock signal CLK at a certain time t0, active command ACT is input, and address signals A0 to A11 at that time are taken in as row address signals RA0 to RA11.

In response thereto, equalizer 16 is made non-activated to stop the equalization of bit line pair BL, /BL, and word line WL of the row corresponding to row address signals RA0 to RA11 is raised to "H" level, which is a selected level, by row decoder 11, whereby memory cell MC is activated and sensing amplifier 15 is activated.

Next, at the rising edge of clock signal CLK at time t1 when one clock cycle has passed since time t0, writing command WRT is input, and address signals A0 to A11 at that time are taken in as column address signals CA0 to CA11. In response thereto, the column selection line CSL corresponding to column address signals CA0 to CA11 fare raised to "H" level, which is a selected level, by column decoder 12, whereby the bit line pair BL, /BL of the column is connected to data bus DBE (or DBO) via column selection gate 14 and data input/output line pair IO, /IO.

Next, in synchronization with the rising edge and the subsequent falling edge of clock signal CLK at time t2 when one clock cycle has passed (writing latency WL=1) since time t1, the rising edge and the falling edge of external data strobe signal DQS are respectively input, and two data signals are input. The two input data signals are latched respectively by latch circuits 29, 30 of FIG. 3 to become signals φ29, φ30.

Also, in response to the falling edge of signal DQS, either one of signals φEV, φOD (φEV in FIG. 12) is pulsewise raised to "H" level, and output signals φ29, φ30 of latch circuits 29, 30 are latched by latch circuits (30, 32 in this case) to become signals φ31, φ32.

Next, in response to the rising edge of clock signal CLK at time t3 when two clock cycles have passed (tW=2) since time t1, signal WDRV is pulsewise raised to "H" level. When signal WDRT is raised to "H" level, transfer gates 27, 28 of FIG. 3 become conducted to give output signals φ31, φ32 of latch circuits 31, 32 to memory arrays 5, 6 via transfer gates 27, 28 and data buses DBE, DBO. Signals φ31, φ32 given to memory arrays 5, 6 are written into two memory cells MC selected by address signals RA0 to RA11, CA0 to CA11.

Next, at the rising edge of clock signal CLK at time t4 when one clock cycle has passed since time t3, precharging command PCG is input. In response thereto, word line WL is raised to "L" level, which is a non-selected level, by row decoder 11, whereby memory cell MC is made non-activated, sensing amplifier 15 is made non-activated, and equalizer 16 is activated to precharge bit line pair BL, /BL to a bit line precharging potential VBL. Therefore, in the normal operation mode, the minimum period of time tRC needed for writing the data signal corresponds to five clock cycles.

Figure 13:
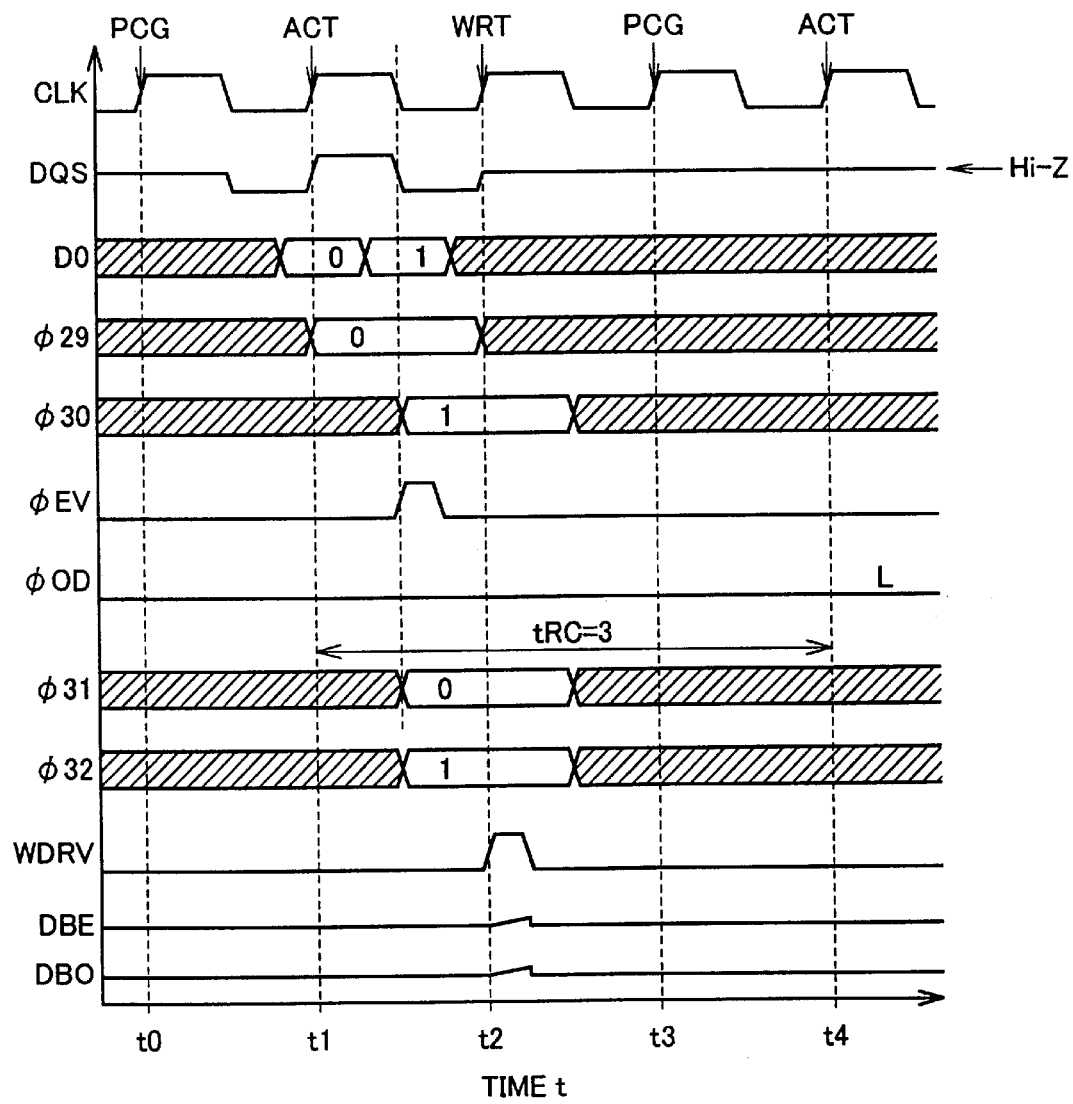
FIG. 13 is a time chart showing a writing operation of the DDR SDRAM shown in FIGS. 1 to 11 in the testing mode.

FIG. 13 is a time chart illustrating a writing operation of the DDR SDRAM shown in FIGS. 1 to 11 in the testing mode. Referring to FIG. 13, at the rising edge of clock signal CLK at a certain time t1, an active command ACT is input, and address signals A0 to A11 at that time are taken in as row address signals RA0 to RA11.

In response thereto, equalizer 16 is made non-activated to stop the equalization of bit line pair BL, /BL, and the word line WL corresponding to row address signals RA0 to RA11 is raised to "H" level, which is a selected level, by row decoder 11, whereby memory cell MC is activated and sensing amplifier 15 is activated.

Also, in synchronization with the rising edge and the subsequent falling edge of clock signal CLK at time t1, the rising edge and the falling edge of external data strobe signal DQS are respectively input, and two data signals are input. The two input data signals are latched respectively by latch circuits 29, 30 of FIG. 3 to become signals φ29, φ30.

Also, in response to the falling edge of signal DQS, either one of signals φEV, φOD (φEV in FIG. 13) is pulsewise raised to "H" level, and the output signals φ29, φ30 of latch circuits 29, 30 are latched by latch circuits 31, 32 to become signals φ31, φ32.

Next, at the rising edge of clock signal CLK at time t2 when one clock cycle has passed since time t1, a writing command WRT is input, and address signals A0 to A11 at that time are taken in as column address signals CA0 to CA11. In response thereto, column selection line CSL of the column corresponding to column address signals CA0 to CA11 is raised to "H" level, which is a selected level, by column decoder 12, and the bit line pair BL, /BL of the column is connected to data bus DBE (or DBO) via column selection gate 14 and data input/output line pair IO, /IO.

Also, in response to the rising edge of clock signal CLK at time t2, signal WDRV is pulsewise raised to "H" level. When signal WDRV is raised to "H" level, transfer gates 27, 28 of FIG. 3 become conducted to give output signals φ31, φ32 of latch circuits 31, 32 to memory arrays 5, 6 via transfer gates 27, 28 and data buses DBE, DBO. Signals φ31, φ32 given to memory arrays 5, 6 are written into two memory cells MC selected by address signals RA0 to RA11, CA0 to CA11.

Next, at the rising edge of clock signal CLK at time t3 when the next one clock cycle has passed since time t2, a precharging command PCG is input. In response thereto, word line WL is lowered to "L" level, which is a non-selected level, by row decoder 11, whereby memory cell MC is made non-activated, sensing amplifier 15 is made non-activated, and equalizer 16 is activated to precharge bit line pair BL, /BL to bit line precharging potential VBL. Therefore, in the testing mode, the minimum period of time tRC needed for writing a data signal corresponds to three clock cycles.

In this embodiment, a writing operation having a writing latency is carried out in the normal operation mode, and a writing operation without having a writing latency is carried out in the testing mode, so that the testing time is short even if the test is carried out at a low frequency.

Figure 14:
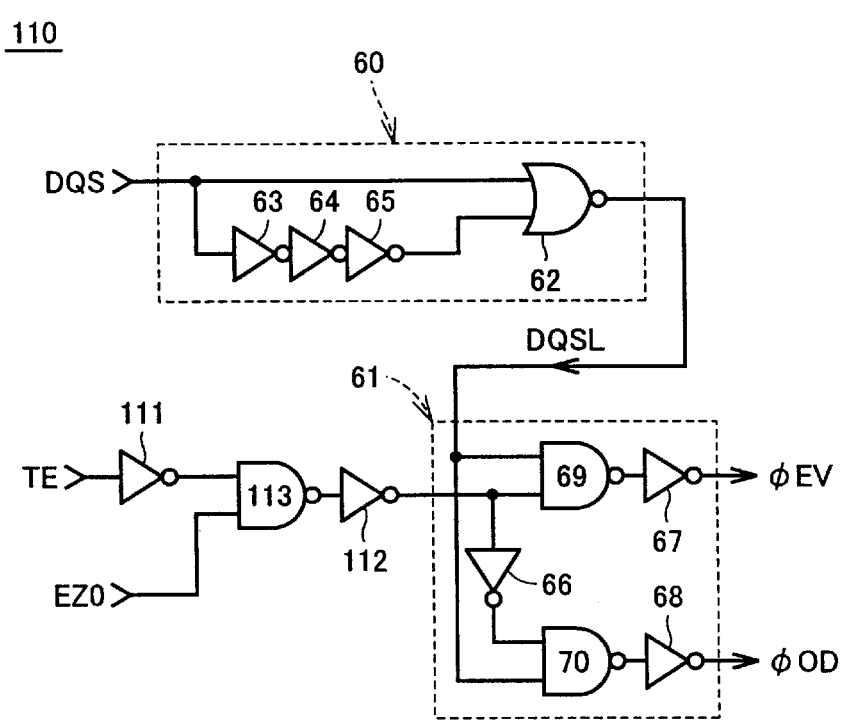
FIG. 14 is a circuit diagram illustrating a modification of this embodiment.

Here, signal generating circuit 60 of FIG. 6 may be replaced with a signal generating circuit 110 of FIG. 14. Signal generating circuit 110 is a circuit obtained by adding inverters 111, 112 and a NAND gate 113 to signal generating circuit 59. Test signal TE is input into one input node of NAND gate 113 via inverter 111. Signal EZ0 is input into the other input node of NAND gate 113. The output signal of NAND gate 113 is input into the other input node of NAND gate 69 via inverter 112, and is input into the other input node of NAND gate 70 via inverters 112, 66.

In the normal operation mode, test signal TE is set at "L" level, which is a non-activated level, and signal EZ0 passes NAND gate 113 and inverter 112 to be input into a gate circuit 61. In this case, signal generating circuit 110 has the same construction as signal generating circuit 60. In the testing mode, test signal TE is set at "H" level, which is an activated level; the output signal of inverter 112 is fixed at "L" level, and signal φEV is fixed at "L" level; and pulse signal DQSL passes NAND gate 70 and inverter 68 to become signal φOD. Therefore, in the testing mode, there is no need to take address signal A0 in, so that the testing operation can be simplified.

Here, it goes without saying that the output signals of inverters 67, 68 are let to be signals φOD, φEV, respectively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device that takes in an external control signal, an external address signal, and an external data signal in synchronization with a clock signal, said semiconductor memory device comprising:
   a memory array having a plurality of memory cells arranged in plural rows and plural columns, a plurality of word lines respectively disposed in correspondence with said plural rows, and a plurality of bit line pairs respectively disposed in correspondence with said plural columns;
   a row selection circuit that takes in said external address signal as a row address signal in response to an active command being issued by said external control signal, selects one of said plurality of word lines in accordance with the row address signal, and activates each memory cell corresponding to the selected word line;
   a column selection circuit that takes in said external address signal as a column address signal in response to a writing command being issued by said external control signal, and selects one of said plurality of bit line pairs in accordance with the column address signal; and
   a writing circuit that, in a normal operation mode, takes in said external data signal when a predetermined first period of time passes after said writing command is issued following said active command and, in a testing mode, receives said external data signal without waiting for the elapse of said predetermined first period of time in response to said active command being issued, to write the external data signal into the memory cell activated by said row selection circuit via the bit line pair selected by said column selection circuit.

2. The semiconductor memory device according to claim 1, wherein
   said semiconductor memory device comprises two memory arrays, receives two external data signals consecutively input in synchronization with a leading edge and a trailing edge contained in the external clock signal, and receives an external data strobe signal having a leading edge and a trailing edge that are synchronized with the two external data signals,
   said row selection circuit selects one of said plurality of word lines in each memory array in accordance with the row address signal, and activates each memory cell corresponding to the selected word line,
   said column selection circuit selects one of said plurality of bit line pairs in each memory array in accordance with the column address signal, and
   said writing circuit takes in said two external data signals in response to the leading edge and the trailing edge of said external data strobe signal, writes one of the two external data signals into the memory cells of one of said two memory arrays, and writes the other external data signal into the memory cells of the other memory array.

3. The semiconductor memory device according to claim 2, wherein said writing circuit comprises:
   an input buffer that, in the normal operation mode, is activated in response to said active command being issued and, in the testing mode, is activated at all times, to generate an internal data signal in accordance with said external data signal;
   first and second latch circuits that are respectively disposed in correspondence with said two memory arrays, each for holding and outputting the internal data signal generated in said input buffer; and
   a first switching circuit that gives the internal data signal generated in said input buffer to said first latch circuit in response to the leading edge of said external data strobe signal, and gives the internal data signal generated in said input buffer to said second latch circuit in response to the trailing edge of said external data strobe signal.

4. The semiconductor memory device according to claim 3, further comprising:
   a precharging circuit that precharges each bit line pair to a predetermined potential in response to a precharging command being issued by said external control signal; and
   a first signal generating circuit that, in the normal operation mode, takes in a memory array selection signal contained in said external address signal in response to said writing command being issued and, in the testing mode, takes in said memory array selection signal in response to said precharging command being issued, to output a first or second signal in accordance with the memory array selection signal, wherein
   said writing circuit further comprises:

third and fourth latch circuits that are respectively disposed in correspondence with said two memory arrays, each for holding and outputting an internal data signal generated in said input buffer; and a second switching circuit that gives the internal data signals output from said first and second latch circuits respectively to said third and fourth latch circuits when the first signal is output from said first signal generating circuit, and gives the internal data signals output from said first and second latch circuits respectively to said fourth and third latch circuits when the second signal is output from said first signal generating circuit.

5. The semiconductor memory device according to claim 4, further comprising a second signal generating circuit that, in the normal operation mode, outputs a third signal when a predetermined second period of time passes after said writing command is issued and, in the testing mode, outputs said third signal in response to said writing command, wherein said writing circuit further comprises a third switching circuit for giving the internal data signals output from said third and fourth latch circuits respectively to the selected memory cells of said two memory arrays in response to said third signal being output from said second signal generating circuit.

6. The semiconductor memory device according to claim 3, further comprising:

a precharging circuit that precharges each bit line pair to a predetermined potential in response to a precharging command being issued by said external control signal; and a first signal generating circuit that, in the normal operation mode, receives a memory array selection signal contained in said external address signal in response to said writing command being issued, to output a first or second signal in accordance with the memory array selection signal and, in the testing mode, outputs a preselected one of the first and second signals, wherein said writing circuit further comprises:

third and fourth latch circuits that are respectively disposed in correspondence with said two memory arrays, each for holding and outputting an internal data signal generated in said input buffer; and a second switching that gives the internal data signals output from said first and second latch respectively to said third and fourth latch circuit when the first signal is output from said first signal generating circuit, and gives the internal data signals output from said first and second latch circuits respectively to said fourth and third latch circuits when the second signal is output from said first signal generating circuit.

7. The semiconductor memory device according to claim 6, further comprising a second signal generating circuit that, in the normal operation mode, outputs a third signal when a predetermined second period of time passes after said writing command is issued and, in the testing mode, outputs said third signal in response to said writing command, wherein said writing circuit further comprises a third switching circuit for giving the internal data signals output from said third and fourth latch circuits respectively to the selected memory cells of said two memory arrays in response to said third signal being output from said second signal generating circuit.

* * * * *